(12) United States Patent
Akagawa et al.

(10) Patent No.: US 11,079,666 B2
(45) Date of Patent: Aug. 3, 2021

(54) LIGHT SOURCE DEVICE AND PROJECTOR

(71) Applicant: SEIKO EPSON CORPORATION, Tokyo (JP)

(72) Inventors: Tomoko Akagawa, Matsumoto (JP); Hidefumi Sakata, Kamiina-Gun Tatsuno-Machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/919,563

(22) Filed: Jul. 2, 2020

(65) Prior Publication Data
US 2021/0003910 A1 Jan. 7, 2021

(30) Foreign Application Priority Data
Jul. 5, 2019 (JP) .............................. JP2019-126105

(51) Int. Cl.
| | |
|---|---|
| *G03B 21/20* | (2006.01) |
| *G02B 27/28* | (2006.01) |
| *H04N 9/31* | (2006.01) |
| *H01L 33/50* | (2010.01) |

(52) U.S. Cl.
CPC ......... *G03B 21/204* (2013.01); *G02B 27/283* (2013.01); *G03B 21/2013* (2013.01); *G03B 21/2066* (2013.01); *G03B 21/2073* (2013.01); *H01L 33/50* (2013.01); *H04N 9/3158* (2013.01); *H04N 9/3161* (2013.01); *H04N 9/3164* (2013.01); *H04N 9/3167* (2013.01)

(58) Field of Classification Search
CPC .............. G03B 21/204; G03B 21/2013; G03B 21/2066; G03B 21/2073; G02B 27/283; H04N 9/3158; H04N 9/3161; H04N 9/3164; H04N 9/3167
USPC .......................................................... 353/31
See application file for complete search history.

(56) References Cited

U.S. PATENT DOCUMENTS

| | | | |
|---|---|---|---|
| 2012/0140183 A1 | 6/2012 | Tanaka et al. | |
| 2015/0153020 A1* | 6/2015 | Akiyama | H04N 9/3194 353/20 |
| 2020/0285138 A1* | 9/2020 | Kurata | G02B 27/102 |

FOREIGN PATENT DOCUMENTS

| | | |
|---|---|---|
| JP | 2011-138627 A | 7/2011 |
| JP | 2012-137744 A | 7/2012 |

\* cited by examiner

*Primary Examiner* — Jerry L Brooks
(74) *Attorney, Agent, or Firm* — Oliff PLC

(57) ABSTRACT

A light source device according to the present disclosure includes a light emitting section configured to emit first light in a first wavelength band, a wavelength conversion layer configured to convert a part of the first light into second light in a second wavelength band, and a polarization split element configured to reflect third light having the first wavelength band and a first polarization direction, transmit fourth light having the first wavelength band and a second polarization direction, reflect fifth light having the second wavelength band and the first polarization direction, and transmit sixth light having the second wavelength band and the second polarization direction. Light intensity of the fourth light is controlled by controlling light intensity of light having the first polarization direction out of the first light entering the wavelength conversion layer and light intensity of light having the second polarization direction.

15 Claims, 13 Drawing Sheets

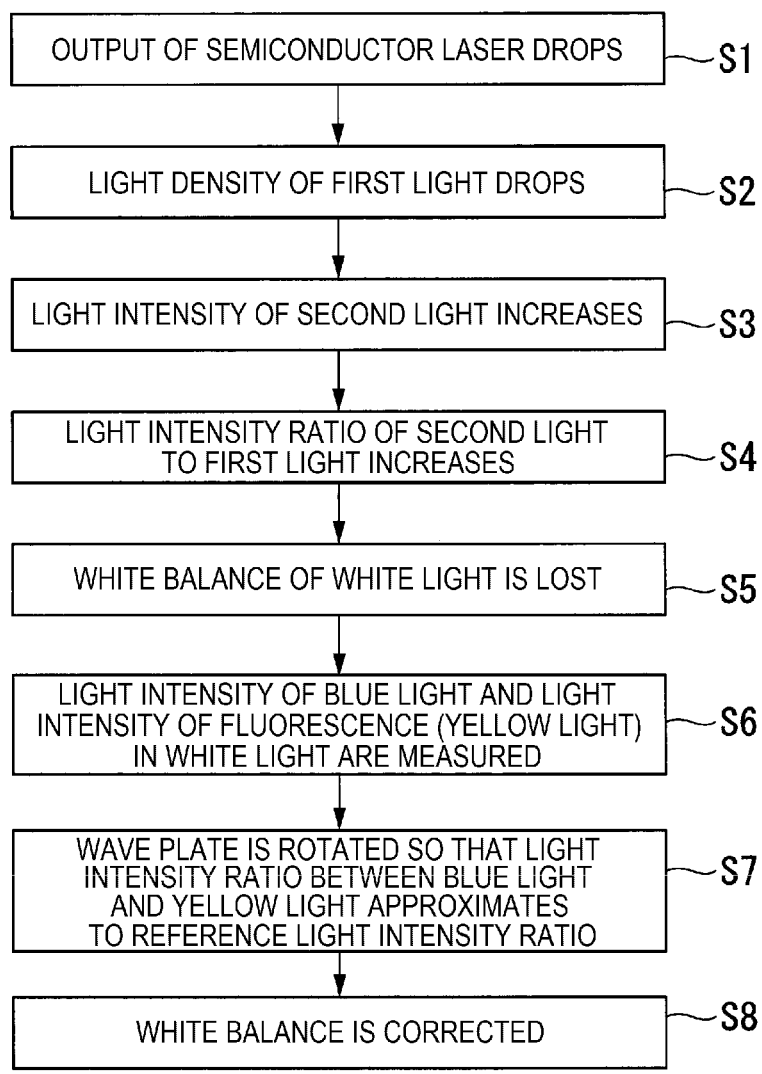

LIGHT SOURCE DEVICE AND PROJECTOR

The present application is based on, and claims priority from JP Application Serial Number 2019-126105, filed Jul. 5, 2019, the disclosure of which is hereby incorporated by reference herein in its entirety.

BACKGROUND

1. Technical Field

The present disclosure relates to a light source device and a projector.

2. Related Art

As a light source device used for a projector, there is proposed a light source device using fluorescence emitted from a phosphor when irradiating the phosphor with excitation light emitted from a light source. In JP-A-2012-137744 (Document 1), there is disclosed a light source device provided with a solid-state light source unit, a dichroic mirror, a fluorescence emitting plate, a first wave plate, a reflecting plate, and a second wave plate. In this light source device, a ratio between P-polarized light and S-polarized light included in the light entering a dichroic mirror is adjusted using the second wave plate. Thus, an amount of light entering the fluorescence emitting plate and an amount of light entering the reflecting plate are controlled to adjust the white balance.

In JP-A-2011-138627 (Document 2), there is disclosed a light source device provided with a light emitting element for emitting blue light, a transmissive wavelength conversion element for converting the blue light into yellow light, a light guide member for propagating the yellow light, and a reflective polarization element disposed on an exit surface of the light guide member. In this light source device, the light having one polarization direction out of the light emitted from the light guide member is reflected by the reflective polarization element, then re-enters the wavelength conversion element, and is then reflected by a reflecting film of the wavelength conversion element. On this occasion, a part of the light is rotated in polarization direction to thereby be converted into light to be transmitted through the reflective polarization element, and is then reused as illumination light.

In such a light source device provided with the transmissive wavelength conversion element as in Document 2, there is also demanded such a configuration capable of adjusting the white balance as in Document 1.

SUMMARY

Alight source device according to an aspect of the present disclosure includes a light emitting section configured to emit first light having a first wavelength band, a wavelength conversion layer having a first surface which the first light enters, and a second surface different from the first surface, and configured to convert a part of the first light into second light having a second wavelength band different from the first wavelength band, and emit the second light and another part of the first light from the second surface, and a polarization split element which is disposed so as to be opposed to the second surface of the wavelength conversion layer, and is configured to reflect third light having the first wavelength band and a first polarization direction and emitted from the second surface, transmit fourth light having the first wavelength band and a second polarization direction different from the first polarization direction and emitted from the second surface, reflect fifth light having the second wavelength band and the first polarization direction and emitted from the second surface, and transmit sixth light having the second wavelength band and the second polarization direction and emitted from the second surface, wherein light intensity of the fourth light is controlled by controlling light intensity of light having the first polarization direction out of the first light entering the wavelength conversion layer, and light intensity of light having the second polarization direction out of the first light entering the wavelength conversion layer.

The light source device according to the aspect of the present disclosure may further include a detection section configured to detect the fourth light and the sixth light transmitted through the polarization split element, and a control section configured to compare a detection result by the detection section with a predetermined value to thereby control the light intensity of the light having the first polarization direction out of the first light entering the wavelength conversion layer, and the light intensity of the light having the second polarization direction out of the first light entering the wavelength conversion layer.

The light source device according to the aspect of the present disclosure may further include a wave plate which is disposed between the light emitting section and the wavelength conversion layer, and which the first light emitted from the light emitting section enters, wherein the control section may rotate the wave plate to thereby control the light intensity of the light having the first polarization direction out of the first light entering the wavelength conversion layer, and the light intensity of the light having the second polarization direction out of the first light entering the wavelength conversion layer.

In the light source device according to the aspect of the present disclosure, the light emitting section may be made rotatable around a rotational axis crossing the first polarization direction and the second polarization direction, and the control section may rotate the light emitting section to thereby control the light intensity of the light having the first polarization direction out of the first light entering the wavelength conversion layer, and the light intensity of the light having the second polarization direction out of the first light entering the wavelength conversion layer.

The light source device according to the aspect of the present disclosure may further include an optical element disposed so as to be opposed to the first surface of the wavelength conversion layer, and configured to transmit the first light and reflect the second light.

In the light source device according to the aspect of the present disclosure, the third light reflected by the polarization split element may enter the wavelength conversion layer from the second surface of the wavelength conversion layer to be converted into the second light.

In the light source device according to the aspect of the present disclosure, the fifth light reflected by the polarization split element may enter the wavelength conversion layer from the second surface of the wavelength conversion layer, and a part of the fifth light entering the wavelength conversion layer from the second surface may be converted into the sixth light.

A projector according to another aspect of the present disclosure includes the light source device according to the aspect of the present disclosure, a light modulation device configured to modulate light from the light source device in accordance with image information, and a projection optical device configured to project the light modulated by the light modulation device.

BRIEF DESCRIPTION OF THE DRAWINGS

FIG. 6 is a flowchart showing a concept of an adjustment of the white balance.

DESCRIPTION OF EXEMPLARY EMBODIMENTS

First Embodiment

Figure 1:
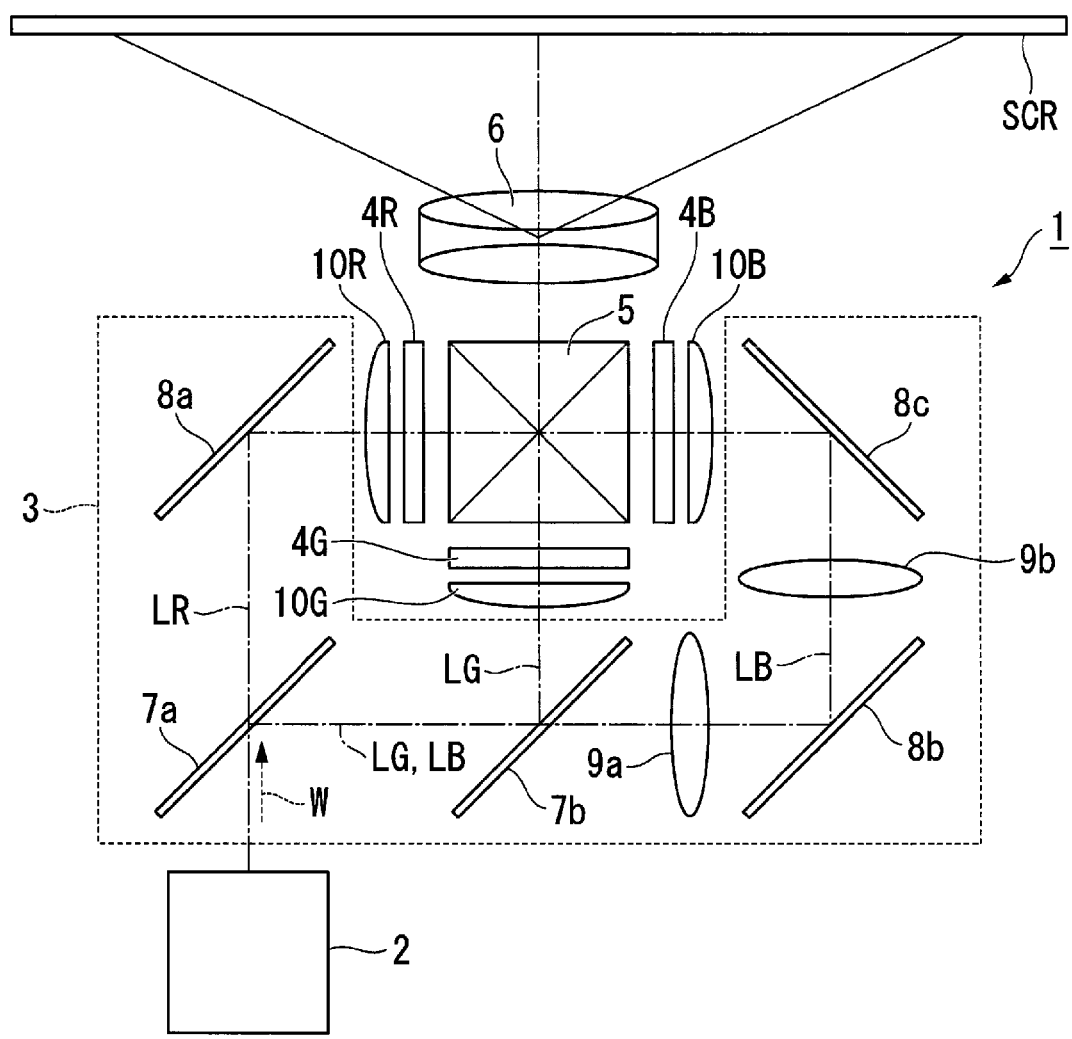
FIG. 1 is a schematic configuration diagram of a projector according to a first embodiment.

Hereinafter, a first embodiment of the present disclosure will be described using FIG. 1 through FIG. 10.

In the drawings described below, the constituents are shown with the respective scale ratios of the sizes different from each other in some cases in order to make the constituents eye-friendly.

An example of a projector according to the present embodiment will be described.

FIG. 1 is a diagram showing a schematic configuration of the projector 1 according to the present embodiment.

As shown in FIG. 1, the projector 1 according to the present embodiment is a projection-type image display device for displaying a color image on a screen SCR. The projector 1 is provided with an illumination device 2, a color separation optical system 3, a light modulation device 4R, a light modulation device 4G, a light modulation device 4B, a combining optical system 5, and a projection optical device 6. The configuration of the illumination device 2 will be described later.

The color separation optical system 3 is provided with a first dichroic mirror 7a, a second dichroic mirror 7b, a reflecting mirror 8a, a reflecting mirror 8b, a reflecting mirror 8c, a relay lens 9a, and a relay lens 9b. The color separation optical system 3 separates white light LW emitted from the illumination device 2 into red light LR, green light LG and blue light LB, then guides the red light LR to the light modulation device 4R, guides the green light LG to the light modulation device 4G, and guides the blue light LB to the light modulation device 4B.

A field lens 10R is disposed between the color separation optical system 3 and the light modulation device 4R, and substantially collimates the incident light and then emits the result toward the light modulation device 4R. A field lens 10G is disposed between the color separation optical system 3 and the light modulation device 4G, and substantially collimates the incident light and then emits the result toward the light modulation device 4G. A field lens 10B is disposed between the color separation optical system 3 and the light modulation device 4B, and substantially collimates the incident light and then emits the result toward the light modulation device 4B.

The first dichroic mirror 7a transmits the red light component and reflects the green light component and the blue light component. The second dichroic mirror 7b reflects the green light component, and transmits the blue light component. The reflecting mirror 8a reflects the red light component. The reflecting mirror 8b and the reflecting mirror 8c reflect the blue light component.

The red light LR having been transmitted through the first dichroic mirror 7a is reflected by the reflecting mirror 8a, and is then transmitted through the field lens 10R to enter an image forming area of the light modulation device 4R for the red light. The green light LG having been reflected by the first dichroic mirror 7a is further reflected by the second dichroic mirror 7b, and then transmitted through the field lens 10G to enter an image forming area of the light modulation device 4G for the green light. The blue light LB having been transmitted through the second dichroic mirror 7b enters an image forming area of the light modulation device 4B for the blue light via the relay lens 9a, the reflecting mirror 8b on the incident side, the relay lens 9b, the reflecting mirror 8c on the exit side, and the field lens 10B.

The light modulation device 4R, the light modulation device 4G, and the light modulation device 4B each modulate the colored light as the incident light in accordance with image information to thereby form image light. The light modulation device 4R, the light modulation device 4G, and the light modulation device 4B are each formed of a liquid crystal light valve. Although not shown in the drawings, on the light incident side of each of the light modulation device 4R, the light modulation device 4G, and the light modulation device 4B, there is disposed an incident side polarization plate. On the light exit side of each of the light modulation device 4R, the light modulation device 4G, and the light modulation device 4B, there is disposed an exit side polarization plate.

The combining optical system 5 combines the image light emitted from the light modulation device 4R, the image light emitted from the light modulation device 4G, and the image light emitted from the light modulation device 4B with each other to form full-color image light. The combining optical system 5 is formed of a cross dichroic prism having four rectangular prisms bonded to each other to have a substantially square shape in the plan view. On the boundary surfaces having a substantially X shape on which the rectangular prisms are bonded to each other, there are formed dielectric multilayer films.

The image light having been emitted from the combining optical system 5 is projected by the projection optical device 6 in an enlarged manner to form an image on the screen SCR. In other words, the projection optical device 6 projects the light modulated by the light modulation device 4R, the light modulated by the light modulation device 4G, and the light modulated by the light modulation device 4B. The projection optical device 6 is constituted by a plurality of projection lenses.

An example of the illumination device 2 in the present embodiment will be described.

Figure 2:
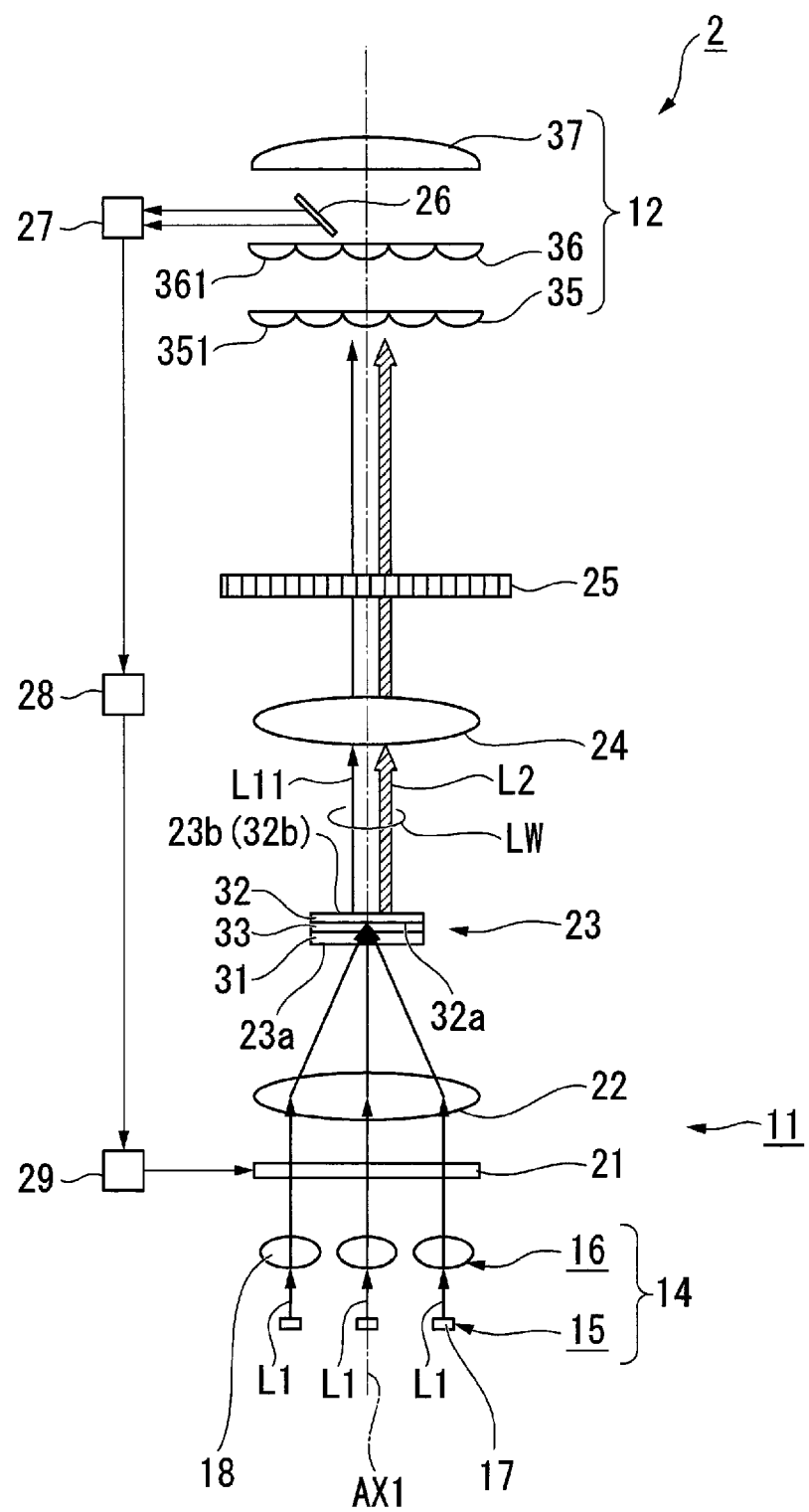
FIG. 2 is a schematic configuration diagram of an illumination device according to the first embodiment.

FIG. 2 is a diagram showing a schematic configuration of the illumination device 2.

As shown in FIG. 2, the illumination device 2 is provided with a light source device 11 and a homogenization illumination optical system 12.

The light source device 11 is provided with a light emitting section 14, a wave plate 21 (a retardation element), a condenser lens 22, a wavelength conversion element 23, a collimator lens 24, a reflective polarization element 25 (a polarization split element), a light intensity monitoring mirror 26, a sensor unit 27 (a detection section), a control section 28, and a rotation mechanism 29.

The light emitting section 14 has alight source unit 15 and a collimator optical system 16. The light emitting section 14 emits first light L1 having a first wavelength band formed of a laser beam.

The light source unit 15 has a plurality of semiconductor lasers 17 for emitting the first light L1. The first wavelength band of the first light L1 is in a range of, for example, 440 through 450 nm, and the peak wavelength of the emission intensity is, for example, 445 nm. In other words, the first light L1 is the blue light. The plurality of semiconductor lasers 17 is arranged in an array in a plane perpendicular to an illumination light axis AX1. In the present embodiment, for example, nine semiconductor lasers 17 are arranged in a 3×3 array, but the number and the arrangement of the semiconductor lasers 17 are not particularly limited. It is also possible for the semiconductor lasers 17 to emit the first light L1 having a peak wavelength other than 445 nm, for example, a peak wavelength of 455 nm or 460 nm.

The collimator optical system 16 is constituted by a plurality of collimator lenses 18. The collimator lenses are disposed so as to correspond to the respective semiconductor lasers 17, and are arranged in an array in a plane perpendicular to the illumination light axis AX1. The collimator lenses 18 each convert the first light L1 emitted from the corresponding semiconductor laser 17 into parallel light. It should be noted that the illumination light axis AX1 is defined as a central axis of the first light emitted from the central semiconductor laser 17 out of the plurality of semiconductor layers 17 arranged in an array.

The first light L1 to be emitted from each of the semiconductor lasers 17 of the light emitting section 14 is linearly polarized light having a specific polarization direction. The first light L1 is, for example, S-polarized light in the present embodiment, but can also be P-polarized light. It should be noted that in the light source device 11, the wave plate 21, the wavelength conversion element 23, and the reflective polarization element 25 are disposed so that the respective surfaces of incidence of light are perpendicular to the illumination light axis AX1 and parallel to each other.

Therefore, the S-polarized light is S-polarized light with respect to any of the wave plate 21, the wavelength conversion element 23, and the reflective polarization element 25, and the P-polarized light is P-polarized light with respect to any of the wave plate 21, the wavelength conversion element 23, and the reflective polarization element 25. Therefore, in the following description, the linearly polarized light described above is simply referred to as S-polarized light or P-polarized light, and the description regarding what optical element the polarized light is S-polarized light or P-polarized light with respect to will be omitted.

The wave plate 21 is disposed on the light path between the collimator optical system 16 and the condenser lens 22. The wave plate 21 is disposed so as to be able to rotate in a plane perpendicular to the illumination light axis AX1, namely the plane of incidence of the first light L1. The wave plate 21 is formed of a ½ wave plate with respect to the wavelength of 445 nm as the peak wavelength of the first light L1. The optical axis of the wave plate 21 crosses the polarizing axis of the first light L1 entering the wave plate 21. It should be noted that the optical axis of the wave plate 21 can be either one of a fast axis and a slow axis of the wave plate 21.

As described above, the first light L1 includes only the S-polarization component at the moment when being emitted from the light emitting section 14. It should be noted that since the polarizing axis of the first light L1 crosses the optical axis of the wave plate 21, by the first light L1 being transmitted through the wave plate 21, a part of the S-polarization component is converted into a P-polarization component. As a result, the first light L1 transmitted through the wave plate 21 becomes the light having the S-polarization component and the P-polarization component mixed with each other at a predetermined ratio.

To the wave plate 21, there is coupled the rotation mechanism 29 for rotating the wave plate 21. The configuration of the rotation mechanism 29 for the wave plate 21 will be described later.

The condenser lens 22 makes the first light L1 emitted from the wave plate 21 converge and enter the wavelength conversion element 23. The condenser lens 22 is formed of a convex lens.

The wavelength conversion element 23 is provided with a base member 31, a wavelength conversion layer 32, and a dichroic mirror 33 (an optical element). The base member 31, the dichroic mirror 33, and the wavelength conversion layer 32 are stacked on one another in this order from a first surface 23a of the wavelength conversion element 23 which the first light L1 enters toward a second surface 23b thereof.

The base member 31 is formed of a light transmissive material. Further, it is desirable for the light transmissive member constituting the base member 31 to have high thermal conductivity.

The wavelength conversion layer 32 has a first surface 32a which the first light enters, and a second surface 32b different from the first surface 32a. The wavelength conversion layer 32 converts a part of the first light L1 having the first wavelength band into second light L2 having a second wavelength band different from the first wavelength band. As described above, since a part of the first light L1 is converted into the second light L2, and another part of the first light L1 is not converted into the second light L2, white light LW including the other part L11 of the first light L1 and the second light L2 is emitted from the wavelength conversion layer 32. In other words, the white light LW including the other part L11 of the first light L1 and the second light L2 is emitted from the second surface 32b of the wavelength conversion layer 32. Therefore, the wavelength conversion layer 32 is a transmissive wavelength conversion layer which the first light enters from the first surface 32a, and which emits the white light LW including the other part L11 of the first light L1 and the second light L2 from the second surface 32b. Similarly, the wavelength conversion element 23 is a transmissive wavelength conversion element which the first light enters from the first surface 23a, and which emits the white light LW including the other part L11 of the first light L1 and the second light L2 from the second surface 23b.

The wavelength conversion layer 32 can include a ceramic phosphor, or can also include a single crystal phosphor. The second wavelength band is in a range of, for example, 490 through 750 nm. Therefore, the second light L2 is yellow light including a green light component and a red light component.

The wavelength conversion layer 32 includes, for example, an yttrium aluminum garnet (YAG) type phosphor. Citing YAG:Ce including cerium (Ce) as an activator agent as an example, as the wavelength conversion layer 32, there can be used a material obtained by mixing raw powder including constituent elements such as $Y_2O_3$, $Al_2O_3$, and $CeO_3$ to cause the solid-phase reaction, Y—Al—O amorphous particles obtained by a wet process such as a coprecipitation process or a sol-gel process, and YAG particles obtained by a gas-phase process such as a spray drying process, a flame heat decomposition process, or a thermal plasma process.

Out of the first light L1 having entered the wavelength conversion layer 32, the other part L11 of the first light L1 not to be converted into the second light L2 is emitted from the wavelength conversion layer 32 in a state in which the polarization direction is kept. Therefore, assuming that the P-polarized light and the S-polarized light are included in the first light L1 entering the wavelength conversion layer 32, a ratio between the P-polarized light and the S-polarized light included in the first light L1 entering the wavelength conversion layer 32 is equal to a ratio between the P-polarized light and the S-polarized light included in the first light L1 to be emitted from the wavelength conversion layer 32. In contrast, the second light L2 obtained by performing the wavelength conversion on the first light L1 in the wavelength conversion layer 32 is the light including the P-polarization component and the S-polarization component. In the following description, the ratio between the P-polarized light and the S-polarized light is referred to as a polarization ratio.

The dichroic mirror 33 is provided to the first surface 32a of the wavelength conversion layer 32. In other words, the dichroic mirror 33 is disposed between the base member 31 and the wavelength conversion layer 32. The dichroic mirror 33 transmits the first light L1 and reflects the second light L2. The dichroic mirror 33 is formed of a dielectric multilayer film. The dielectric multilayer film is formed of a film obtained by alternately stacking, for example, a plurality of layers of $SiO_2$ and a plurality of layers of $TiO_2$. In other words, the dielectric multilayer film has a configuration having dielectric films of two types different in refractive index from each other alternately stacked on one another. The number of layers and the film thickness of the dielectric films constituting the dielectric multilayer film are not particularly limited.

The collimator lens 24 substantially collimates the white light LW emitted from the wavelength conversion element 23. The collimator lens 24 is formed of a convex lens.

The reflective polarization element 25 is disposed on the light path between the collimator lens 24 and the homogenization illumination optical system 12. In other words, the reflective polarization element 25 is disposed so as to be opposed to the second surface 32b of the wavelength conversion layer 32 across the collimator lens 24. The reflective polarization element 25 reflects blue S-polarized light (third light having the first wavelength band and a first polarization direction) emitted from the second surface 32b, transmits blue P-polarized light (fourth light having the first wavelength band and a second polarization direction) emitted from the second surface 32b, reflects yellow S-polarized light (fifth light having the second wavelength band and the first polarization direction) emitted from the second surface 32b, and transmits yellow P-polarized light (sixth light having the second wavelength band and the second polarization direction) emitted from the second surface 32b.

The reflective polarization element 25 is formed of a wire-grid polarization element having a plurality of metal thin wires made of, for example, aluminum disposed on one surface of the base member at a fine pitch. When using the wire-grid polarization element, it is possible to enhance the heat resistance of the reflective polarization element 25. It should be noted that it is possible to use a reflective polarization element using an organic material as the reflective polarization element 25.

The homogenization illumination optical system 12 has a first lens array 35, a second lens array 36, and an overlapping lens 37.

The first lens array 35 has a plurality of first lenses 351 for dividing the white light LW emitted from the reflective polarization element 25 into a plurality of partial light beams. The plurality of first lenses 351 is arranged in a matrix in a plane perpendicular to the illumination light axis AX1.

The second lens array 36 has a plurality of second lenses 361 corresponding respectively to the plurality of first lenses 351 of the first lens array 35. The second lens array 36 images the image of each of the first lenses 351 of the first lens array 35 in the vicinity of each of the image forming areas of the light modulation devices 4R, 4G, and 4B in cooperation with the superimposing lens 37. The plurality of second lenses 361 is arranged in a matrix in a plane perpendicular to the illumination light axis AX1.

The superimposing lens 37 collects the partial light beams emitted from the second lens array 36 to superimpose with each other in the vicinity of each of the image forming areas of the light modulation devices 4R, 4G, and 4B. Thus, the first lens array 35, the second lens array 36, and the superimposing lens 37 homogenize the in-plane light intensity distribution of the white light LW.

On the light path between the second lens array 36 and the superimposing lens 37, there is disposed the light intensity monitoring mirror 26. The light intensity monitoring mirror 26 is disposed so as to form an angle of 45° with the illumination light axis AX1. The light intensity monitoring mirror 26 transmits a part of the incident light, and reflects the rest of the incident light. The light having been transmitted through the light intensity monitoring mirror 26 enters the superimposing lens 37, and the light having been reflected by the light intensity monitoring mirror 26 enters the sensor unit 27. The detailed configuration of the sensor unit 27 will be described later.

Figure 5:
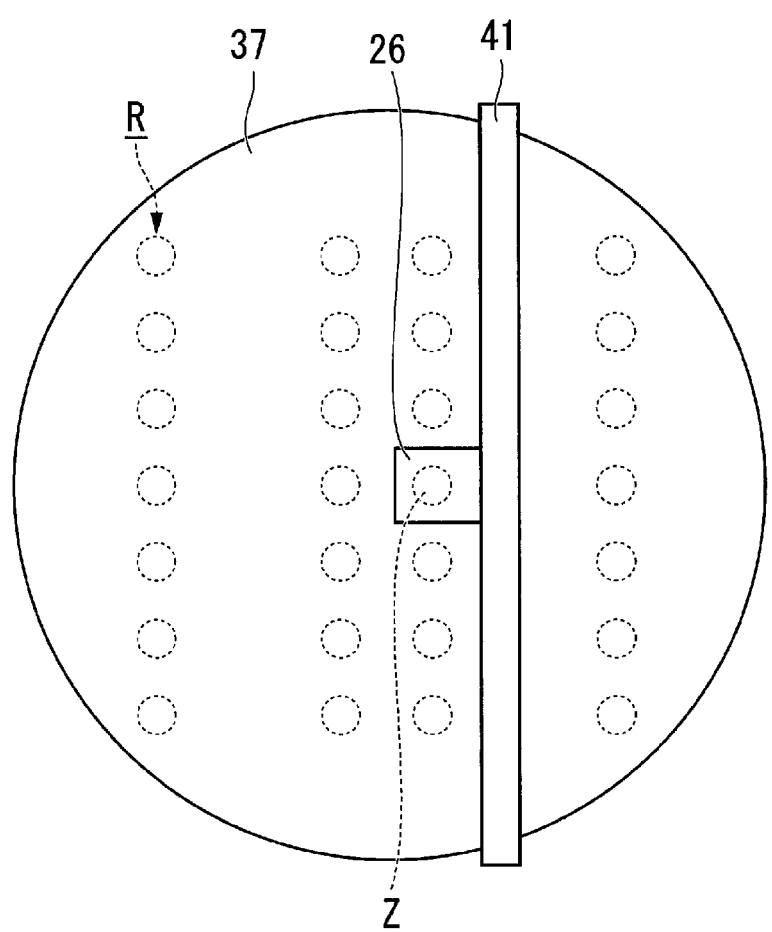
FIG. 5 is a diagram showing an arrangement of a light intensity monitoring mirror with respect to a superimposing lens.

FIG. 5 is a front view showing an arrangement of the light intensity monitoring mirror 26 with respect to the superimposing lens 37.

As shown in FIG. 5, the light intensity monitoring mirror 26 is held by a holding member 41 disposed around the light incident area R of the superimposing lens 37. The light incident area R denotes an area which each of the partial light beams emitted from the second lens array 36. The light intensity monitoring mirror 26 is disposed at the position where a secondary light source image Z of the white light LW is formed.

In the case of the present embodiment, the light intensity monitoring mirror 26 is disposed at a formation position of the secondary light source image Z on the light path between the second lens array 36 and the superimposing lens 37. Therefore, even when the light intensity monitoring mirror 26 is disposed in the light path to take out a part of the light, there is no chance that the illuminance variation occurs on the light modulation device 4R for the red light, the light modulation device 4G to the green light, and the light modulation device 4B for the blue light as illumination target areas. Therefore, when the illuminance deterioration as much as one secondary light source image can be allowed, it is not necessarily required for the light intensity monitoring mirror 26 to be a mirror for transmitting a part of the light and reflecting the rest of the light, and it is also possible for the light intensity monitoring mirror 26 to be a mirror for reflecting the whole of the light.

Hereinafter, the rotation mechanism 29 for the wave plate 21 will be described.

Figure 3:
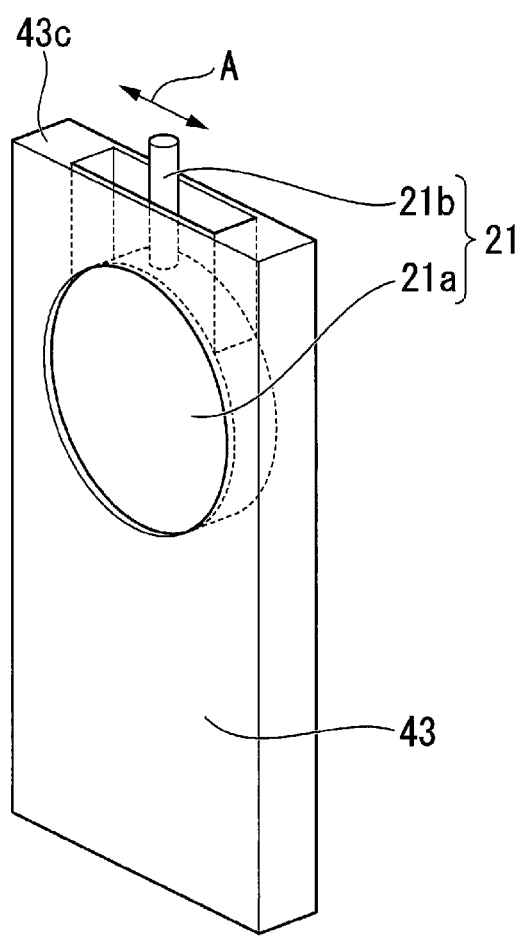
FIG. 3 is a perspective view showing a wave plate and rotary adjustment mechanism.

FIG. 3 is a perspective view showing the wave plate 21 and the rotation mechanism 29.

As shown in FIG. 3, the wave plate 21 is provided with a plate member 21a shaped like a circle, and a rod-like part 21b projecting outward from the plate member 21a. The wave plate 21 rotatably held by a holding member 43. The rod-like part 21b of the wave plate 21 projects outside the holding member 43. The wave plate 21 rotates in accordance with the rod-like part 21b moving in a direction along an end surface 43c of the holding member 43, namely a direction indicated by the arrow A.

Figure 4:
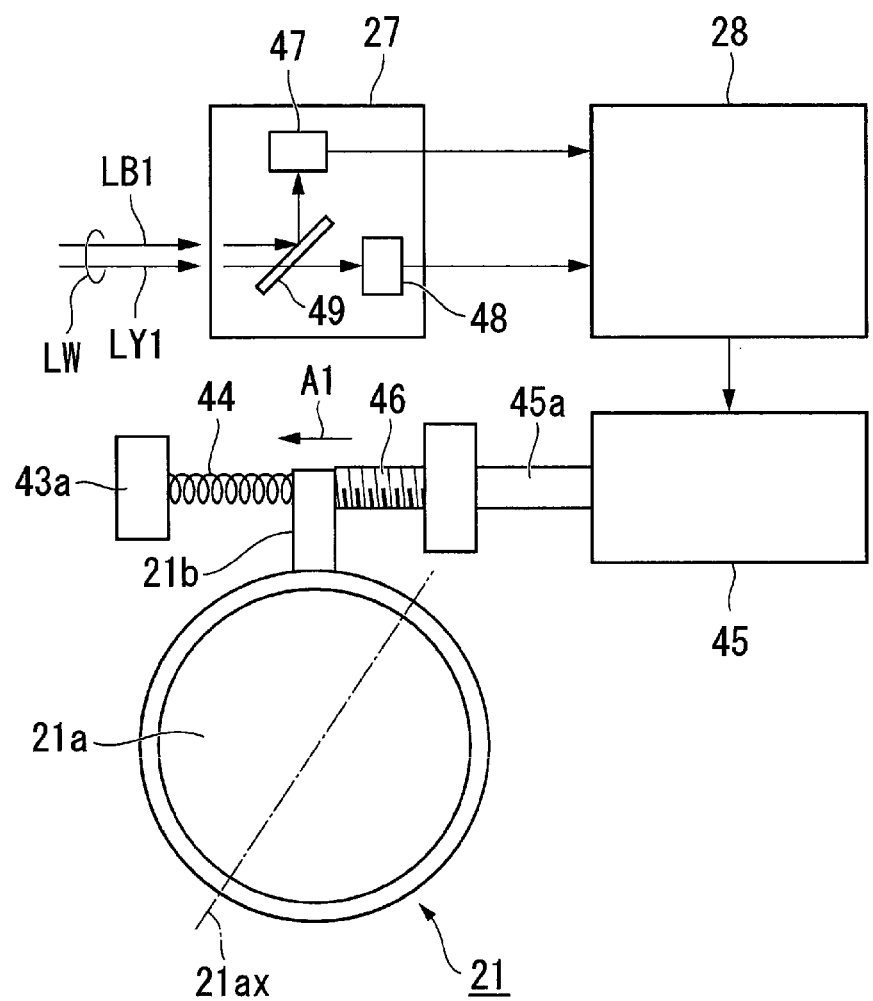
FIG. 4 is a schematic diagram showing the wave plate and a control section.

FIG. 4 is a schematic diagram showing the wave plate 21 and the control section 28.

As shown in FIG. 4, a spring 44 is disposed in a space between the rod-like part 21b of the wave plate 21 and a wall part 43a of the holding member 43. Further, a screw member 46 is fixed to a tip of a rotary shaft 45a of a motor 45. When the screw member 46 rotates due to the rotation of the motor 45, the screw member 46 pushes the rod-like part 21b in the direction of the arrow A1 shown in FIG. 4, and the wave plate 21 rotates counterclockwise. When the force of the screw member 46 pushing the rod-like part 21b is released, the wave plate 21 rotates clockwise due to the action of the spring 44 to return to a neutral position. Due to the rotation of the wave plate 21, an optical axis 21ax of the wave plate 21 rotates.

The sensor unit 27 is provided with a blue light sensor 47 for detecting the intensity of the blue light, a yellow light sensor 48 for detecting the intensity of the yellow light, and a dichroic mirror 49 for separating the blue light and the yellow light from each other. The white light LW having been taken out from the light intensity monitoring mirror 26 enters the sensor unit 27, and is separated by the dichroic mirror 49 into the blue light LB1 and the yellow light LY1. The intensity of the blue light LB1 is detected by the blue light sensor 47. The intensity of the yellow light LY1 is detected by the yellow light sensor 48. In such a manner, the sensor unit 27 detects the blue P-polarized light and the yellow P-polarized light transmitted through the reflective polarization element 25.

The detection result of the intensity of the blue light LB1 and the detection result of the intensity of the yellow light LY1 from the sensor unit 27 are output to the control section 28. The control section 28 rotates the wave plate 21 to change the direction of the optical axis 21c of the wave plate 21 so that the ratio between the intensity of the blue light LB1 and the intensity of the yellow light LY1 approximates to a reference value. The reference value of the ratio between the intensity of the blue light LB1 and the intensity of the yellow light LY1 can be a value decided based on an initial intensity of the blue light LB1 and an initial intensity of the yellow light LY1 measured by the sensor unit 27 at a time point when starting use of the projector 1. Alternatively, it is also possible to use a design value of the projector 1 as the reference value of the ratio between the intensity of the blue light LB1 and the intensity of the yellow fluorescence LY1.

The control section 28 rotates the wave plate 21 to thereby control the light intensity of the S-polarized light and the light intensity of the P-polarized light out of the first light L1 entering the wavelength conversion layer 32. Further, the control section 28 controls the light intensity of the S-polarized light and the light intensity of the P-polarized light out of the first light L1 entering the wavelength conversion layer 32 to thereby control the light intensity of the blue P-polarized light to be emitted from the reflective polarization element 25.

Here, there is assumed when the output of the light emitted from the semiconductor lasers 17 drops due to the temporal change when using the projector 1. The concept of the countermeasure in the present embodiment against the misalignment of the white balance caused in this case will be described based on the flow chart shown in FIG. 6.

When the output of the semiconductor lasers 17 drops (S1 in FIG. 6), the light intensity of the first light L1 for exciting the phosphor in the wavelength conversion layer 32 drops accordingly. Drop of the light intensity of the first light is equivalent to drop of light density (light intensity per unit area) of the first light L1 (S2 in FIG. 6).

The phosphor generally has a characteristic that the conversion efficiency when converting the excitation light into the fluorescence rises as the light density of the excitation light drops. Therefore, even when the light intensity of the first light L1 drops, the light intensity of the second light L2 to be emitted from the wavelength conversion layer 32 increases when the increment of the second light L2 due to the increase in the conversion efficiency exceeds the decrement of the second light L2 due to the decrease in light intensity of the first light L1 (S3 in FIG. 6). Here, the explanation will be presented citing when the light intensity of the second light L2 increases as an example, but the light intensity of the second light L2 decreases in some cases. However, in either case, the white balance is lost with respect to the state immediately after starting use of the projector 1.

Here, the light intensity of the first light L1 and the light intensity of the second light L2 both drop in accordance with the drop of the output of the semiconductor lasers 17. However, since the conversion efficiency of the phosphor rises, the ratio of the light intensity of the second light L2 with respect to the light intensity of the first light L1 relatively increases (S4 in FIG. 6). As a result, the ratio between the first light L1 as the blue light and the second light L2 as the yellow light changes to cause the disruption of the white balance of the white light LW with respect to when the temporal change has not occurred (S5 in FIG. 6). Specifically, since the light intensity of the second light L2 as the yellow light increases relatively to the light intensity of the first light L1 as the blue light, the white light LW obtained by combining the first light L1 and the second light L2 with each other becomes yellowish.

Here, the sensor unit 27 measures the light intensity of the blue light LB1 and the light intensity of the yellow light LY1 included in the light taken out from the light intensity monitoring mirror 26 (S6 in FIG. 6). The control section stores in advance the reference value of the ratio between the blue light intensity and the yellow light intensity decided based on the initial intensity values at the moment when starting the use of the projector 1. The control section 28 compares the current light intensity ratio between the blue light and the yellow light detected by the sensor unit 27 with the reference light intensity value having already been stored. As a result, when the difference between the light intensity ratio thus measured and the reference light intensity ratio exceeds an allowable range, the wave plate 21 is rotated so that the current light intensity ratio approximates the reference light intensity ratio (S7 in FIG. 6).

By rotating the wave plate 21 as much as a predetermined angle, it is possible to adjust the ratio between the light intensity of the S-polarized light and the light intensity of the P-polarized light emitted from the wave plate 21. With regard to this example, since the white light is yellowish due to the disruption of the white balance, it is sufficient to relatively increase the light intensity of the blue light emitted from the reflective polarization element 25. Since the reflective polarization element 25 transmits the P-polarized light, in order to increase the light intensity of the blue light to be emitted from the reflective polarization element 25, it is sufficient to relatively increase the light intensity of the P-polarized light included in the first light L1 and relatively decrease the light intensity of the S-polarized light. Thus, since the light intensity of the blue light to be transmitted through the reflective polarization element 25 relatively increases compared to when the white balance is lost, the yellow tinge decreases in the white light, and thus, it is possible to correct the white balance (S8 in FIG. 6).

The fact that the ratio between the light intensity of the S-polarized light and the light intensity of the P-polarized light emitted from the wave plate 21 can be adjusted by rotating the wave plate 21 as much as a predetermined angle will be described using FIG. 7A and FIG. 7B.

Figure 7A:
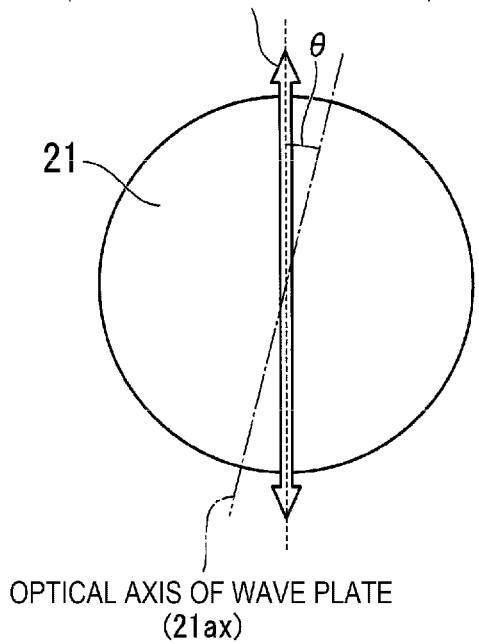
FIG. 7A is a diagram showing a polarization state of light which has not passed through the wave plate.
Figure 7B:
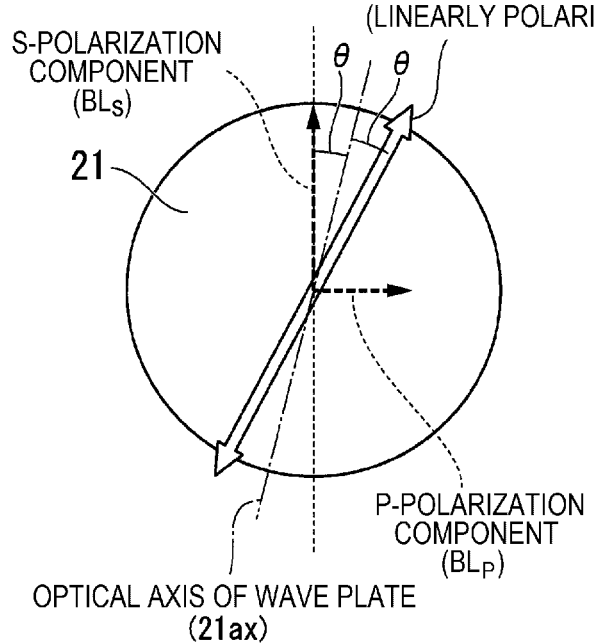
FIG. 7B is a diagram showing the polarization state of the light which has passed through the wave plate.

FIG. 7A is a diagram showing a polarization state of the light which has not passed through the wave plate 21. FIG. 7B is a diagram showing a polarization state of the light which has passed through the wave plate 21.

In the case of the present embodiment, the first light L1 which has not passed through the wave plate 21 is the S-polarized light (linearly polarized light). As shown in FIG. 7A, the wave plate 21 is configured so that the polarization direction P1 of the S-polarized light and the optical axis 21$ax$ of the wave plate 21 cross each other with an angle θ.

After the first light L1 passes through the wave plate 21, the polarization direction P1 rotates clockwise as much as an angle 2θ to turn to a polarization direction P2. On this occasion, there occur the S-polarization component BLs and the P-polarization component BLp, and the ratio between the light intensity of the S-polarization component BLs and the light intensity of the P-polarization component BLp becomes cos(2θ):sin(2θ). When, for example, θ=2° is assumed, the ratio between the light intensity of the S-polarization component BLs and the light intensity of the P-polarization component BLp becomes 14.3:1. Therefore, in the arrangement shown in FIG. 7A and FIG. 7B, by increasing the rotational angle θ, it is possible to relatively increase the light intensity of the P-polarized light with respect to the light intensity of the S-polarized light.

Hereinafter, a method of adjusting the white balance in the light source device 11 according to the present embodiment will be described citing a specific numerical value example.

Figure 8:
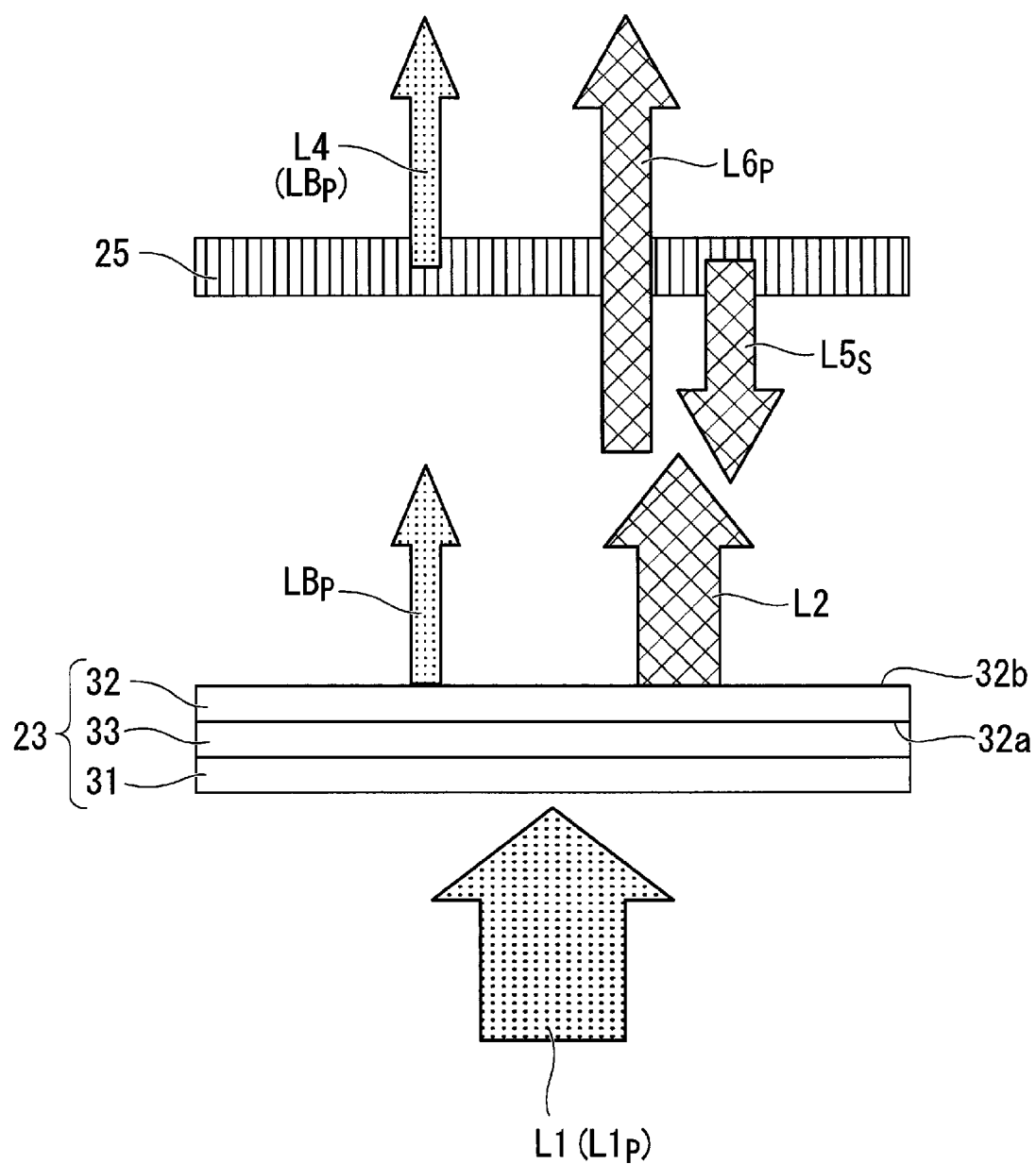
FIG. 8 is a diagram showing a first example of a relationship between a polarization ratio of light entering a wavelength conversion element and a white balance of light emitted from a reflective polarization element.
Figure 9:
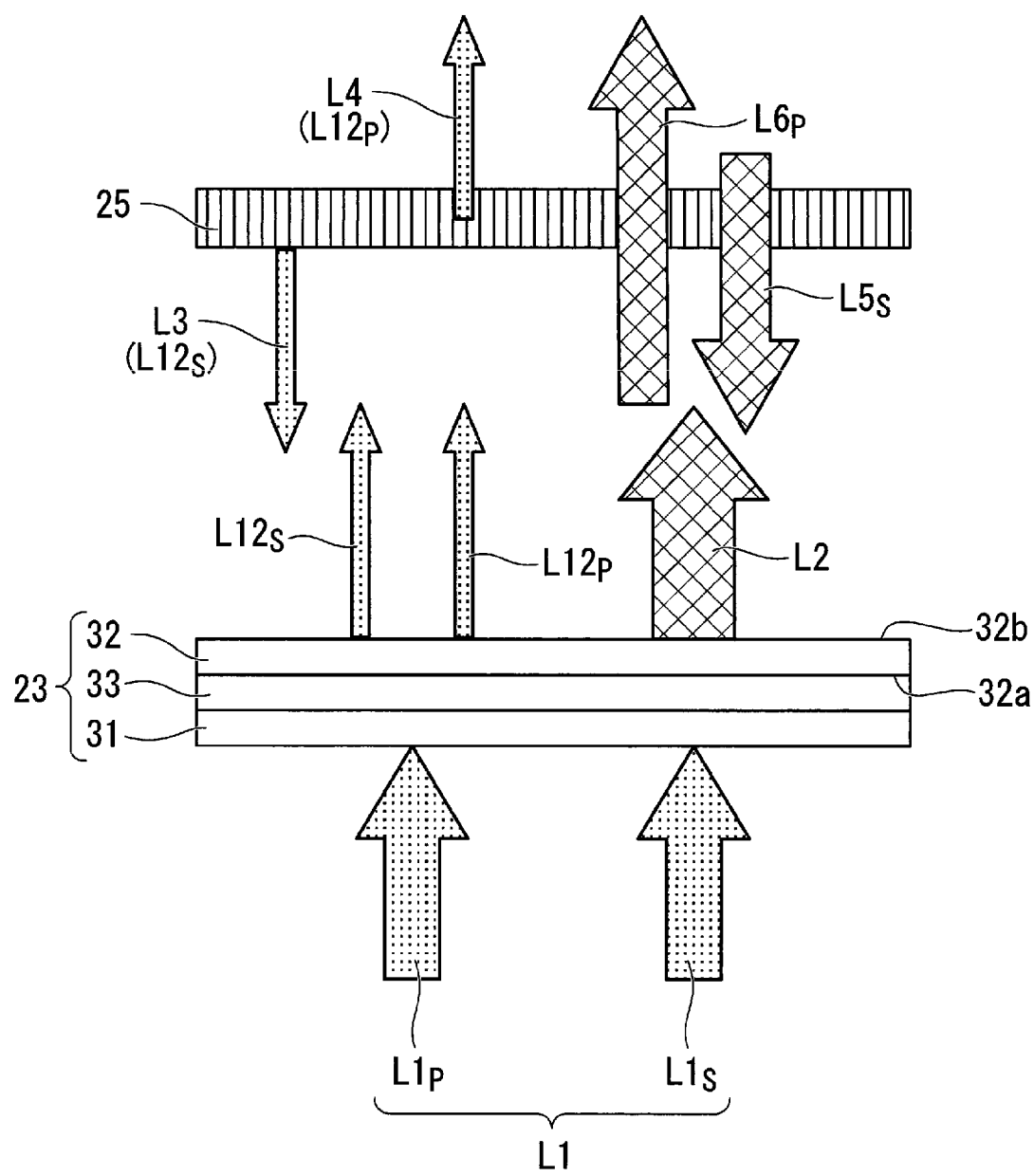
FIG. 9 is a diagram showing a second example of the relationship between the polarization ratio of the light entering the wavelength conversion element and the white balance of the light emitted from the reflective polarization element.
Figure 10:
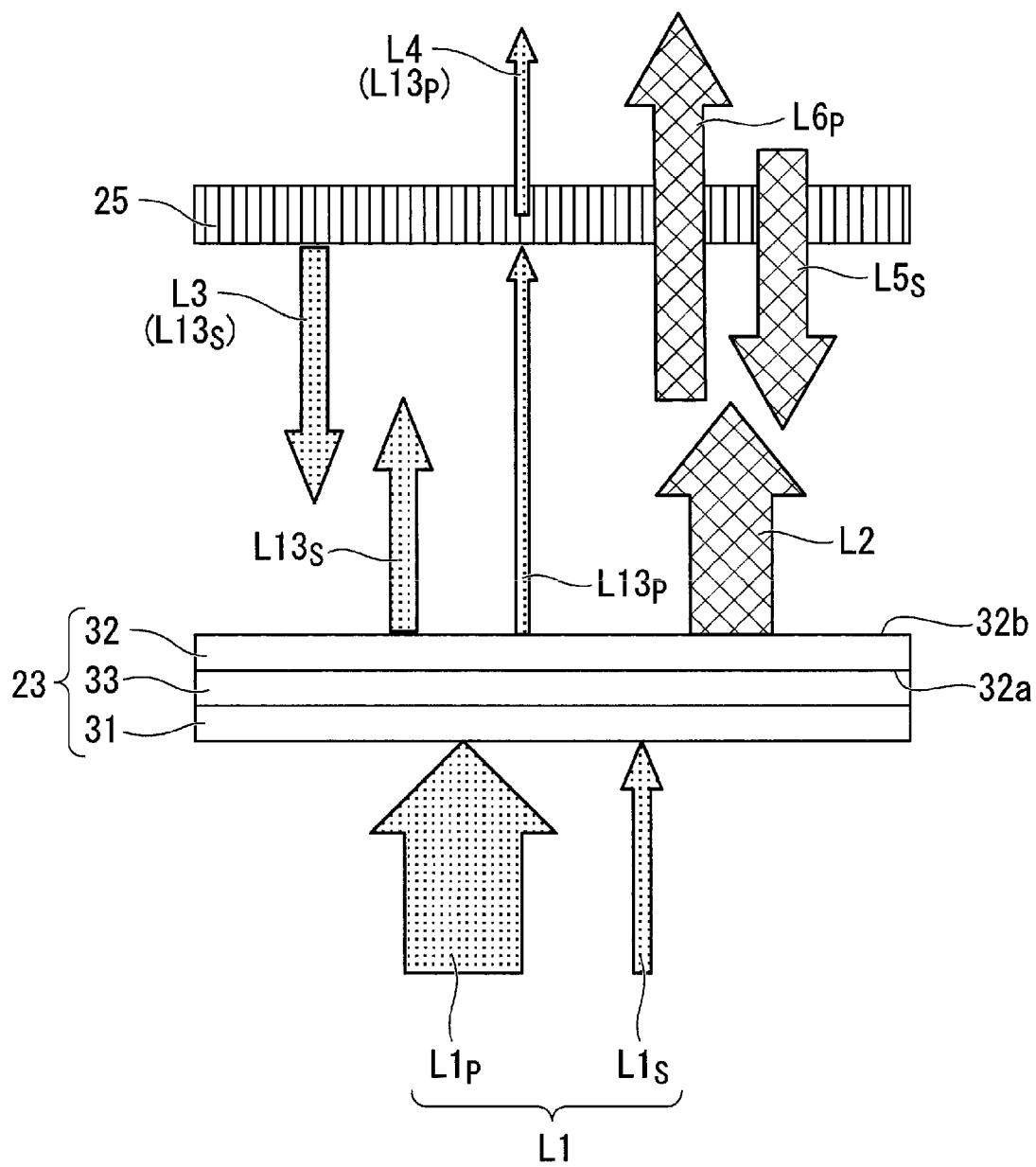
FIG. 10 is a diagram showing a third example of the relationship between the polarization ratio of the light entering the wavelength conversion element and the white balance of the light emitted from the reflective polarization element.

FIG. 8 is a diagram showing a first example of the white balance adjustment. FIG. 9 is a diagram showing a second example of the white balance adjustment. FIG. 10 is a diagram showing a third example of the white balance adjustment.

In the following numerical value example, it is assumed that the wavelength conversion layer 32 transmits 20% of the first light L1, and 80% of the first light L1 is wavelength-converted to turn to the second light L2. Further, in the wavelength conversion layer 32, it is assumed that the light intensity of the first light L1 on which the wavelength conversion has not yet been performed and the light intensity of the second light L2 on which the wavelength conversion has already been performed are equal to each other. Further, it is assumed that the light intensity of the P-polarized light and the light intensity of the S-polarized light included in the second light L2 generated in the wavelength conversion layer 32 are equal to each other. Further, it is assumed that the light absorption by the wavelength conversion layer 32 and the reflective polarization element 25 does not occur.

The first example corresponds to when the polarization ratio of the first light L1 entering the wavelength conversion layer 32 is P-polarized light of 100% and S-polarized light of 0%.

As shown in FIG. 8, when the first light L1 comprising only the P-polarized light L1$p$ enters the wavelength conversion layer 32, since the polarization direction of the light transmitted through the wavelength conversion layer 32 is kept, the blue P-polarized light LBp having the light intensity proportion of 20% to the first light L1 having entered the wavelength conversion layer 32 is transmitted through the wavelength conversion layer 32. The blue P-polarized light LBp corresponds to the fourth light L4 to be transmitted through the reflective polarization element 25.

Meanwhile, the yellow second light L2 having the light intensity proportion of 80% to the first light L1 having entered the wavelength conversion layer 32 is emitted from the wavelength conversion layer 32. Since the reflective polarization element 25 has a property of reflecting the S-polarized light and transmitting the P-polarized light, the S-polarized light L5$s$ (fifth light) having the light intensity proportion of 50% to the yellow second light L2 is reflected by the reflective polarization element 25, and the P-polarized light L6$p$ (sixth light) having the light intensity proportion of 50% is transmitted through the reflective polarization element 25. In other words, the yellow P-polarized light L6$p$ having the light intensity proportion of 40% to the first light L1 having entered the wavelength conversion layer 32 is emitted from the reflective polarization element.

The S-polarized light L5$s$ reflected by the reflective polarization element 25 subsequently re-enters the wavelength conversion layer 32, then repeats the reflection by the dichroic mirror 33 and scattering in the wavelength conversion layer 32 to thereby cause conversion of a part of the S-polarization component into the P-polarization component, and is then emitted from the wavelength conversion layer 32 as the light including the S-polarization component and the P-polarization component. Among the above, the P-polarization component is transmitted through the reflective polarization element 25. Meanwhile, the S-polarized light emitted from the wavelength conversion layer 32 is reflected by the reflective polarization element, and then repeats the action described above.

The second example corresponds to when the polarization ratio of the first light L1 entering the wavelength conversion layer 32 is P-polarized light of 50% and S-polarized light of 50%.

As shown in FIG. 9, when the first light L1 including the P-polarized light L1$p$ and the S-polarized light L1$s$ each having the light intensity proportion of 50% enters the wavelength conversion layer 32, since the polarization direction of the light transmitted through the wavelength conversion layer 32 is kept, the blue P-polarized light L12$p$ having the light intensity proportion of 10% and the blue S-polarized light L12$s$ having the light intensity proportion of 10% to the first light L1 having entered the wavelength conversion layer 32 are transmitted through the wavelength conversion layer 32. The blue P-polarized light L12$p$ having the light intensity proportion of 10% corresponds to the fourth light L4 to be transmitted through the reflective polarization element 25. Further, the blue S-polarized light L12$s$ having the light intensity proportion of 10% corresponds to the third light L3 to be reflected by the reflective polarization element 25.

Further, the action of the second light L2 generated in the wavelength conversion layer 32 is the same as the action of the second light L2 in the first example.

In the case of the second example, the blue S-polarized light L12$s$ having been transmitted through the wavelength conversion layer 32 is reflected by the reflective polarization element 25, and then re-enters the wavelength conversion layer 32. A part of the blue S-polarized light L12$s$ having re-entered the wavelength conversion layer 32 is converted into the yellow second light L2. In such a manner as described above, it is possible for the blue S-polarized light L12$s$ to make a contribution to the wavelength conversion once again by being reflected by the reflective polarization element 25.

The third example corresponds to when the polarization ratio of the first light entering the wavelength conversion layer 32 is P-polarized light of 10% and S-polarized light of 90%.

As shown in FIG. 10, when the first light L1 including the P-polarized light L1$p$ having the light intensity proportion of 10% and the S-polarized light L1$s$ having the light intensity proportion of 90% enters the wavelength conversion layer 32, since the polarization direction of the light transmitted through the wavelength conversion layer 32 is kept, the blue P-polarized light L13$p$ having the light intensity proportion of 2% and the blue S-polarized light L13$s$ having the light intensity proportion of 18% to the first light L1 having entered the wavelength conversion layer 32 are transmitted through the wavelength conversion layer 32. The blue P-polarized light L13$p$ having the light intensity proportion of 2% corresponds to the fourth light L4 to be transmitted through the reflective polarization element 25. The blue S-polarized light L13$s$ having the light intensity proportion of 18% corresponds to the third light L3 to be reflected by the reflective polarization element 25.

Further, the action of the second light L2 generated in the wavelength conversion layer 32 is the same as the action of the second light L2 in the first example.

Further, in the case of the third example, similarly to the second example, it is possible for the blue S-polarized light L13$s$ having been transmitted through the wavelength conversion layer 32 to make a contribution to the wavelength conversion by being reflected by the reflective polarization element 25, and then re-entering the wavelength conversion layer 32.

It should be noted that in FIG. 8 through FIG. 10, there is omitted the illustration of the yellow light which is once reflected by the reflective polarization element 25, then is converted in polarization direction, then enters the reflective polarization element 25 two or more times, and is then transmitted through the reflective polarization element 25.

As shown hereinabove in FIG. 8 through FIG. 10, the higher the proportion of the S-polarized light to the first light L1 entering the wavelength conversion layer 32 becomes, the more the light intensity of the blue P-polarized light LB$p$, L12$p$, and L13$p$ (the fourth light L4) transmitted through the reflective polarization element 25 decreases, and the more the light intensity of the blue S-polarized light L12$s$, L13$s$ (the third light L3) reflected by the reflective polarization element 25 increases. Accordingly to the above, the light intensity of the yellow light which is wavelength-converted in the wavelength conversion layer 32 once again also increases.

In other words, the higher the proportion of the S-polarized light L1$s$ to the first light L1 entering the wavelength conversion layer 32 becomes, the more the light intensity proportion of the blue light to the white light decreases, and the more the light intensity proportion of the yellow light to the white light increases, and therefore, yellowish white light is obtained. In contrast, the higher the proportion of the P-polarized light L1$p$ to the first light L1 entering the wavelength conversion layer 32 becomes, the more the light intensity proportion of the blue light to the white light increases, and the more the light intensity proportion of the yellow light decreases, and therefore, bluish white light is obtained. In such a manner as described above, due to the light source device 11 according to the present embodiment, it is possible to adjust the white balance of the white light.

In the related-art light source provided with a transmissive wavelength conversion element or a transmissive wavelength layer, it is proposed to change the thickness of the wavelength conversion element to thereby adjust the ratio between the light intensity of the blue light and the light intensity of the yellow light. However, in this case, since it is difficult to control the thickness of the wavelength conversion layer, and a variation in thickness is unavoidable, it is difficult to adjust the ratio between the light intensity of the blue light and the light intensity of the yellow light to a desired value. Further, once the wavelength conversion element is manufactured, the ratio between the light intensity of the blue light and the light intensity of the yellow light is fixed to a predetermined value, it is unachievable to cope with the temporal change of the white balance. When applying the light source device to the projector, it is conceivable to adjust the white balance by, for example, decreasing the light intensity of any of the light modulation devices. However, in that case, there is a problem that the projection image becomes dark.

To cope with these problems, the light source device 11 according to the present embodiment is provided with the wavelength conversion element 23 of the transmissive type having the wavelength conversion layer 32 of the transmissive type, and can adjust the white balance of the white light LW to be emitted from the reflective polarization element 25 by arbitrarily rotating the wave plate 21, and is therefore not required to precisely control the thickness of the wavelength conversion layer 32, and is capable of coping with the temporal change of the white balance.

Further, according to the projector 1 related to the present embodiment, since the light source device 11 described above is used, it is unnecessary to decrease the light intensity of the light modulation devices 4R, 4G, and 4B for adjusting the white balance, and thus, it is possible to reduce the possibility that the projection image becomes dark.

Further, in the light source device 11 according to the present embodiment, since the collimator lens 24 is disposed between the wavelength conversion layer 32 and the reflective polarization element 25, the light entering the reflective polarization element 25 is further collimated, and thus, the incident angle distribution of the light entering the reflective polarization element 25 narrows. Thus, the deterioration of the polarization split characteristic of the reflective polarization element is suppressed, and therefore, it is possible to suppress the degradation of the light use efficiency.

It should be noted that it is also possible to adopt a first modified example or a second modified example described below as the measure of adjusting the polarization ratio of the first light L1 entering the wavelength conversion layer 32 instead of the measure of rotating the wave plate 21 in the present embodiment.

First Modified Example

A plurality of types of wave plates different in phase difference when transmitting light from each other is prepared in advance, then, one wave plate with which the desired light intensity ratio can be obtained is selected from the plurality of types of wave plates, and then, the wave plate thus selected is used in the light source device 11. When coping with the temporal change of the white balance, it is sufficient to arbitrarily replace the present wave plate with a wave plate having a different phase difference.

In this configuration, it is not possible to continuously change the light intensity ratio between the blue light and the yellow light as in the embodiment described above of rotating the wave plate, and the value of the light intensity ratio obtained takes discrete values. It should be noted that since the rotation mechanism for the wave plate is unnecessary, the configuration of the light source device 11 can be simplified.

Second Modified Example

A plurality of wave plates equal in phase difference occurring when transmitting the light to each other is prepared in advance, and two or more of the wave plates are layered and used in the light source device so that the desired light intensity ratio can be obtained. When coping with the temporal change of the white balance, it is sufficient to arbitrarily change the number of the wave plates to be layered.

Similarly to the configuration of the first modified example, in the configuration of the second modified example, the value of the light intensity ratio obtained takes discrete values. It should be noted that since the rotation mechanism for the wave plate is unnecessary, the configuration of the light source device 11 can be simplified.

It should be noted that it is also possible to prepare a plurality of wave plates different in thickness from each other instead of changing the number of the wave plates to be layered, and then, select the wave plate having the thickness with which the desired light intensity ratio can be obtained from the wave plates thus prepared.

Second Embodiment

A second embodiment of the present disclosure will hereinafter be described using FIG. 11 through FIG. 14.

A projector according to the second embodiment is substantially the same in configuration as that of the first embodiment, but is different in the configuration of the light source device from that of the first embodiment. Therefore, the description of the projector will be omitted.

Figure 11:
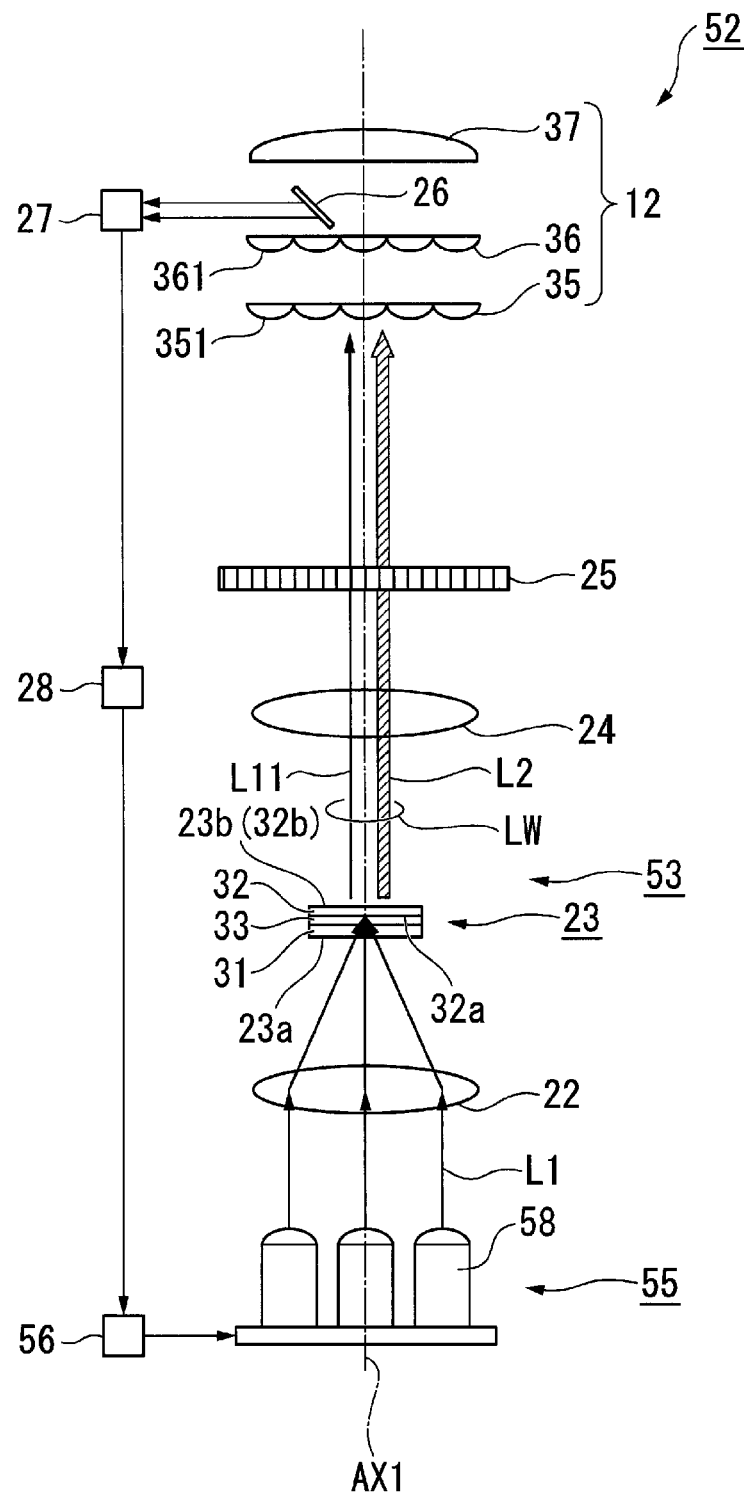
FIG. 11 is a schematic configuration diagram of an illumination device according to a second embodiment.

FIG. 11 is a schematic configuration diagram of an illumination device according to the second embodiment.

In FIG. 11, the constituents common to FIG. 2 used in the first embodiment are denoted by the same reference symbols, and the description thereof will be omitted.

As shown in FIG. 11, the illumination device 52 is provided with a light source device 53 and the homogenization illumination optical system 12.

The light source device 53 is provided with a light emitting section 55, the condenser lens 22, the wavelength conversion element 23, the collimator lens 24, the reflective polarization element 25, the light intensity monitoring mirror 26, the sensor unit 27 (the detection section), the control section 28, and a rotation mechanism 56. The light emitting section 55 is made rotatable around a rotational axis crossing the first polarization direction and the second polarization direction, namely a rotational axis crossing the polarization direction of the S-polarized light and the polarization direction of the P-polarized light.

In the case of the present embodiment, the control section 28 rotates the light emitting section 55 to thereby control the light intensity of the S-polarized light and the light intensity of the P-polarized light out of the first light L1 entering the wavelength conversion layer 32. Further, the control section 28 controls the light intensity of the S-polarized light and the light intensity of the P-polarized light out of the first light L1 entering the wavelength conversion layer 32 to thereby control the light intensity of the blue P-polarized light to be emitted from the reflective polarization element 25. Therefore, in the present embodiment, the wave plate 21 is not disposed between the light emitting section 55 and the condenser lens 22.

Figure 12:
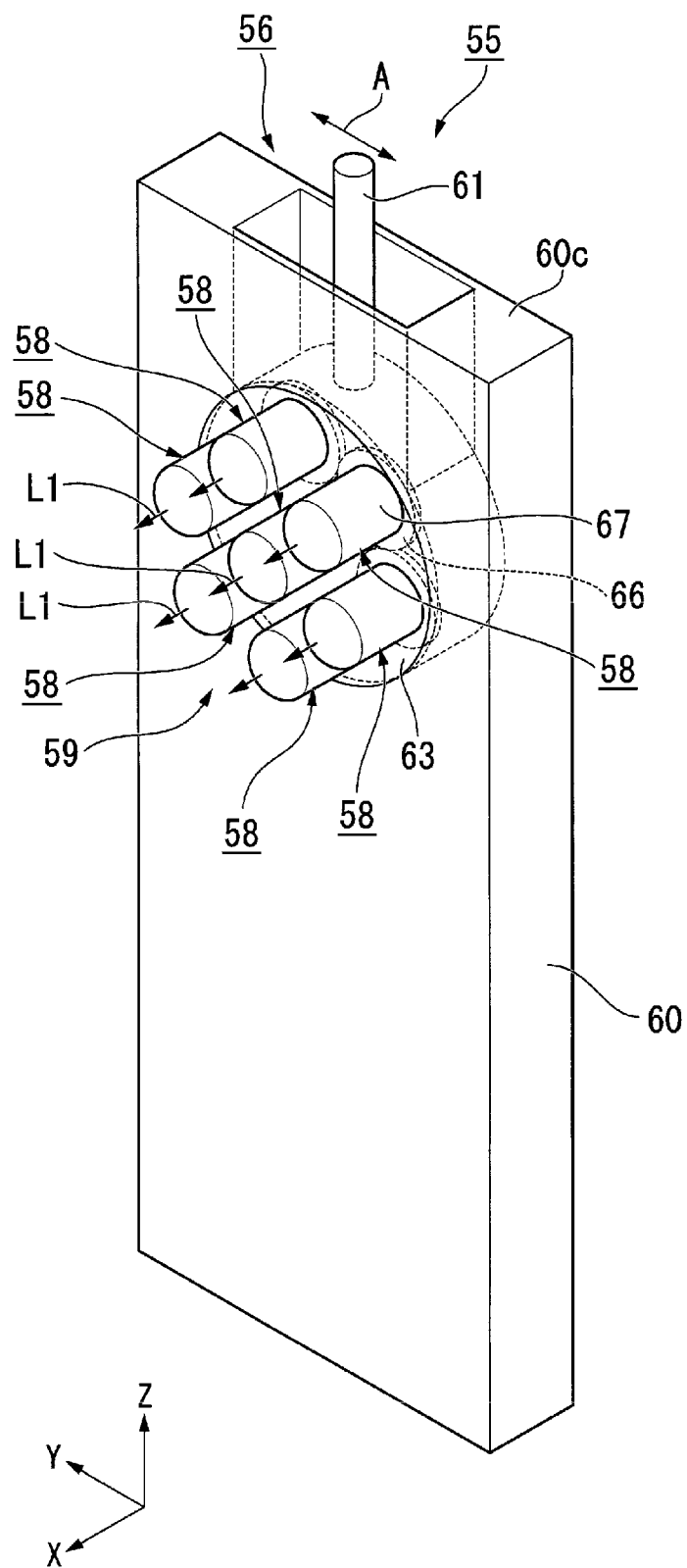
FIG. 12 is a perspective view showing a light emitting section and a rotary adjustment mechanism.

FIG. 12 is a perspective view showing the light emitting section 55 and the rotation mechanism 56.

As shown in FIG. 12, the light source section 55 is provided with a light source unit 59 provided with a plurality of semiconductor lasers 58, and the rotation mechanism 56 for rotating the light source unit 59. The rotation mechanism 56 is provided with a frame part 60 and a rod-like part 61. The frame part 60 rotatably holds the light source unit 59. The rod-like part 61 extends from one end of the light source unit 59, and projects outside the frame part 60. The light source unit 59 rotates in accordance with the rod-like part 61 moving in a direction along an end surface 60c of the frame part 60, namely a direction indicated by the arrow A.

The specific configuration of a section of rotating the light source unit 59 by moving the rod-like part 61 in the direction of the arrow A is substantially the same as the configuration of the section of rotating the wave plate 21 shown in FIG. 4 in the first embodiment.

Figure 13:
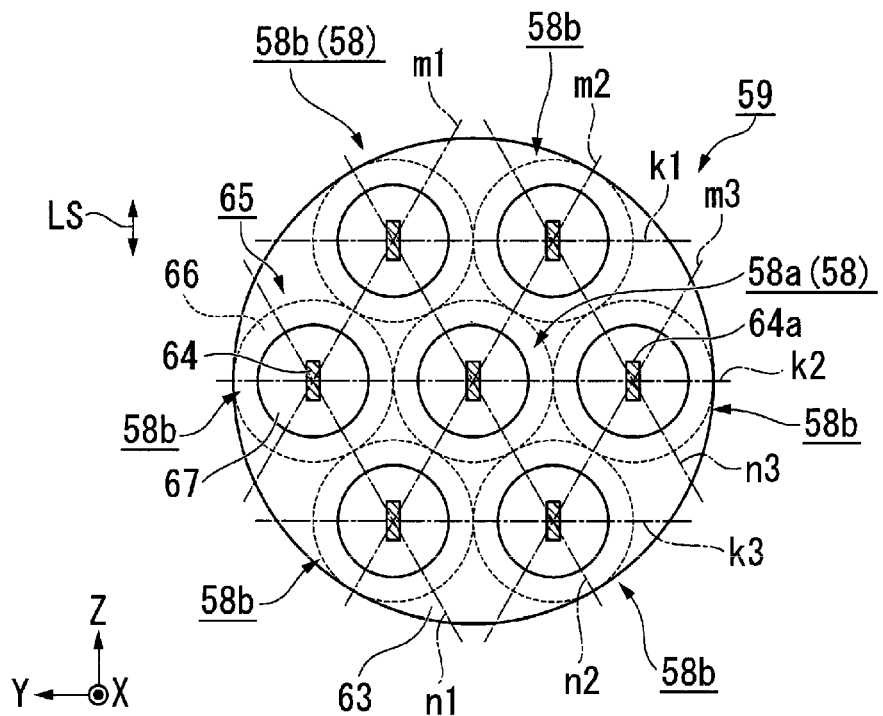
FIG. 13 is a front view of the light emitting section.

FIG. 13 is a front view of the light source unit 59 viewed from the X direction.

As shown in FIG. 13, the light source unit 59 is provided with the plurality of semiconductor lasers 58, and a holding member 63 for holding the plurality of semiconductor lasers 58. The semiconductor lasers 58 each emit the first light L1 having the first wavelength band formed in the X direction. In the present embodiment, the light source unit 59 is provided with seven semiconductor lasers 58. Therefore, light including seven first light beams L1 is emitted as a whole of the light source unit 59.

The semiconductor lasers 58 are each formed of a semiconductor laser of a CAN package type. The semiconductor lasers 58 are each provided with a semiconductor laser chip 64 and a housing 65 for housing the semiconductor laser chip 64. The housing 65 is constituted by a pedestal 66, and a can body 67 covering a one surface side of the pedestal 66. Although in the example shown in FIG. 13, one semiconductor laser chip 64 is housed inside each of the housings 65, it is also possible to house a plurality of semiconductor laser chips 64 inside each of the housings 65.

The holding member 63 is formed of a plate member having circular shape viewed in the emission direction (the X direction) of the first light L1 from the light source unit 59. The plate member is provided with seven holes corresponding to the number of the semiconductor lasers 58, and each corresponding to the dimension of the can body 67. The material of the plate member is not particularly limited, but desirably be, for example, metal high in thermal conductivity. The semiconductor lasers 58 are each supported by the holding member 63 with one surface of the pedestal 66 having contact with one surface of the holding member 63 in the state in which the can body 67 is inserted through the hole of the holding member 63. The holding member 63 holds the plurality of semiconductor lasers 58 at rotationally symmetric positions.

One semiconductor laser 58a of the plurality of semiconductor lasers 58 is disposed on the holding member 63 so as to be located in a central part of the light source unit 59. Other six semiconductor lasers 58b are disposed on the peripheral part of the semiconductor laser 58a located at the center of the holding member 63 in a rotationally symmetric manner so as to surround the one semiconductor laser 58a located at the center.

The six semiconductor lasers 58b located on the periphery are disposed on the holding member 63 so as to be arranged along an imaginary circle circumscribing the six semiconductor lasers 58b centered on the one semiconductor laser 58a located at the center. In the present embodiment, the imaginary circle substantially coincides with a circle forming a contour of the holding member 63. According to the arrangement described above, in the light source unit 59, the angles formed between straight lines k1 through k3, m1 through m3, and n1 through n3 connecting the light emission centers of the respective semiconductor laser chips 64 to each other are equal to each other, and are all 60°. Further, in the plurality of semiconductor lasers 58, the housings 65 of the semiconductor lasers 58 adjacent to each other have contact with each other in the portions of the pedestals 66.

The seven semiconductor lasers 58 are arranged so that the semiconductor laser chips 64 face to the same direction. In the light source unit 59, the semiconductor lasers 58 are arranged so that the long sides of the respective semiconductor laser chips 64 become parallel to the Z axis. According to this arrangement, as indicated by the arrow denoted by the symbol LS, linearly-polarized light beams each having a polarization direction parallel to the Z axis are emitted as the first light L1. In the case of the present embodiment, the linearly-polarized light beam having the polarization direction parallel to the Z direction is the S-polarized light beam.

The semiconductor laser chips 64 each have a light emitting area 64a for emitting the light. The light emitting area 64a has a rectangular planar shape when viewed along the direction of the central axis of the first light L1 emitted.

Figure 14:
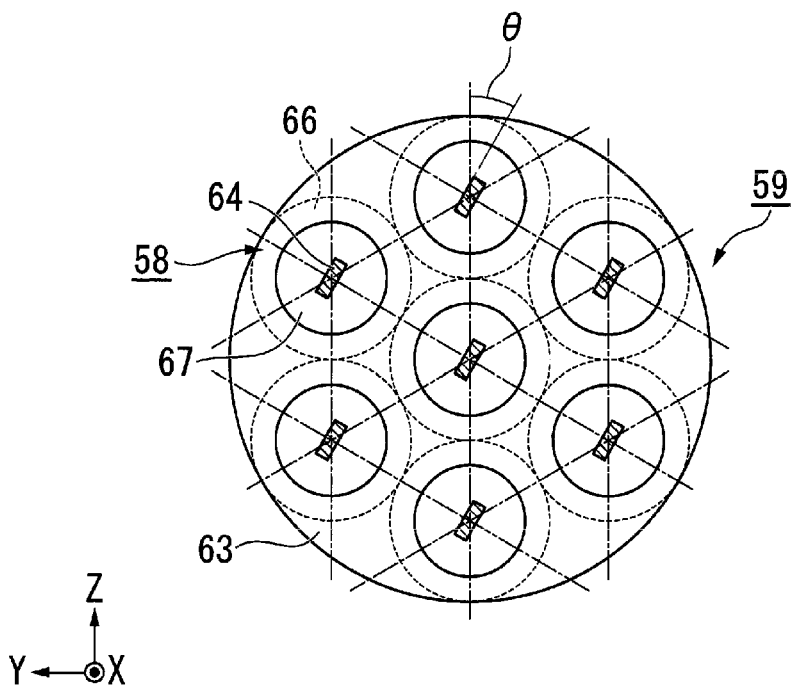
FIG. 14 is a front view showing an example of a reference posture of the light emitting section.

FIG. 14 is a front view of the light source unit 59 set to a reference posture when the white light LW is emitted from the illumination device 2.

As described above, when the light source unit 59 is disposed so that the long side of the light emitting area 64a of the semiconductor laser chip 64 becomes parallel to the Z axis (when the rotation of the light source unit 59 is in a neutral state; see FIG. 13), the first light beams L1 as the S-polarized light beams are emitted from all of the semiconductor lasers 58 to the polarization conversion layer 32. In contrast, when using the projector 1, in other words, when the white illumination light LW is emitted from the illumination device 2, the semiconductor lasers 58 are arranged so that the long side of the light emitting area 64a of the semiconductor laser chip 64 forms a predetermined angle θ with the Z axis as shown in FIG. 14.

In other words, the light source unit 59 is rotated as much as the predetermined angle θ from the posture shown in FIG. 13. As the angle θ of the light source unit 59 is gradually increased from 0°, the proportion of the P-polarized light to the S-polarized light gradually increases, and when the angle θ of the light source unit 59 reaches 90°, all of the first light beams L1 emitted from the light source unit 59 turn to the P-polarized light beams. As described above, by rotating the light source unit 59, it is possible to control the light intensity of the S-polarized light and the light intensity of the P-polarized light out of the first light L1 entering the wavelength conversion layer 32.

The rest of the configuration of the light source device 53 is substantially the same as the configuration of the light source device 11 in the first embodiment.

Also in the present embodiment, it is possible to realize the light source device 53 provided with the wavelength conversion element 23 of the transmissive type having the wavelength conversion layer 32 of the transmissive type, and capable of adjusting the white balance, and thus it is possible to cope with the temporal change of the white balance. Therefore, according to the present embodiment, substantially the same advantages as in the first embodiment can be obtained.

It should be noted that the scope of the present disclosure is not limited to the embodiments described above, but a variety of modifications can be provided thereto within the scope or the spirit of the present disclosure.

For example, as a modified example common to the first and second embodiments described above, the collimator lens is not required to be disposed between the wavelength conversion element and the reflective polarization element. Alternatively, it is also possible to dispose a taper rod lens between the wavelength conversion element and the reflective polarization element instead of the collimator lens.

Further, although in the embodiments described above, there is used the sensor for detecting the light intensity of the blue light and the light intensity of the yellow light which has passed the reflective polarization element as the measure for detecting the shift of the white balance, it is also possible to use a measure of, for example, taking an image projected from the projector to detect the color of the image instead of the sensor.

Further, in the embodiments described above, there is cited an example of the stationary wavelength conversion element which is not made rotatable, but the present disclosure can also be applied to a wavelength conversion element which is made rotatable using a motor.

Besides the above, the specific descriptions of the shape, the number, the arrangement, the material, and so on of each of the constituents of the wavelength conversion element, the light source device, and the projector are not limited to those of the embodiments described above, but can arbitrarily be modified. Although in each of the embodiments, there is described the example of installing the light source device according to the present disclosure in the projector using the liquid crystal light valves, the example is not a limitation. The light source device according to the present disclosure can also be installed in the projector using digital micromirror devices as the light modulation devices.

Although in each of the embodiments, there is described the example of installing the light source device according to the present disclosure in the projector, the example is not a limitation. The light source device according to the present disclosure can also be applied to lighting equipment, a headlight of a vehicle, and so on.

What is claimed is:

1. A light source device comprising: a light emitting section configured to emit first light having a first wavelength band; a wavelength conversion layer having two opposite surfaces including a first surface which the first light enters first, and a second surface different from the first surface, and configured to convert a part of the first light into second light having a second wavelength band different from the first wavelength band, emit the second light from the second surface, and transmits another part of the first light from the second surface; and a polarization split element which is disposed so as to be opposed to the second surface of the wavelength conversion layer, and is configured to reflect third light having the first wavelength band and a first polarization direction and emitted from the second surface, transmit fourth light having the first wavelength band and a second polarization direction different from the first polarization direction and emitted from the second surface, reflect fifth light having the second wavelength band and the first polarization direction and emitted from the second surface, and transmit sixth light having the second wavelength band and the second polarization direction and emitted from the second surface, wherein light intensity of the fourth light is controlled by controlling light intensity of light having the first polarization direction out of the first light entering the wavelength conversion layer, and light intensity of light having the second polarization direction out of the first light entering the wavelength conversion layer.

2. The light source device according to claim 1, further comprising:
a detection section configured to detect the fourth light and the sixth light transmitted through the polarization split element; and
a control section configured to compare a detection result by the detection section with a predetermined value to thereby control the light intensity of the light having the first polarization direction out of the first light entering the wavelength conversion layer, and the light intensity of the light having the second polarization direction out of the first light entering the wavelength conversion layer.

3. The light source device according to claim 2, further comprising:
a wave plate which is disposed between the light emitting section and the wavelength conversion layer, and which the first light emitted from the light emitting section enters, wherein
the control section rotates the wave plate to thereby control the light intensity of the light having the first polarization direction out of the first light entering the wavelength conversion layer, and the light intensity of the light having the second polarization direction out of the first light entering the wavelength conversion layer.

4. The light source device according to claim 2, wherein
the light emitting section is made rotatable around a rotational axis crossing the first polarization direction and the second polarization direction, and
the control section rotates the light emitting section to thereby control the light intensity of the light having the first polarization direction out of the first light entering the wavelength conversion layer, and the light intensity of the light having the second polarization direction out of the first light entering the wavelength conversion layer.

5. The light source device according to claim 1, further comprising:
an optical element disposed so as to be opposed to the first surface of the wavelength conversion layer, and configured to transmit the first light and reflect the second light.

6. A light source device comprising:
a light emitting section configured to emit first light having a first wavelength band;
a wavelength conversion layer having a first surface which the first light enters, and a second surface different from the first surface, and configured to convert a part of the first light into second light having a second wavelength band different from the first wavelength band, and emit the second light and another part of the first light from the second surface; and
a polarization split element which is disposed so as to be opposed to the second surface of the wavelength conversion layer, and is configured to reflect third light having the first wavelength band and a first polarization direction and emitted from the second surface, transmit fourth light having the first wavelength band and a second polarization direction different from the first polarization direction and emitted from the second surface, reflect fifth light having the second wavelength band and the first polarization direction and emitted from the second surface, and transmit sixth light having the second wavelength band and the second polarization direction and emitted from the second surface, wherein
light intensity of the fourth light is controlled by controlling light intensity of light having the first polarization direction out of the first light entering the wavelength conversion layer, and light intensity of light having the second polarization direction out of the first light entering the wavelength conversion layer, and
the third light reflected by the polarization split element enters the wavelength conversion layer from the second surface of the wavelength conversion layer to be converted into the second light.

7. A light source device comprising:
a light emitting section configured to emit first light having a first wavelength band;
a wavelength conversion layer having a first surface which the first light enters, and a second surface different from the first surface, and configured to convert a part of the first light into second light having a second wavelength band different from the first wavelength band, and emit the second light and another part of the first light from the second surface; and
a polarization split element which is disposed so as to be opposed to the second surface of the wavelength conversion layer, and is configured to reflect third light having the first wavelength band and a first polarization direction and emitted from the second surface, transmit fourth light having the first wavelength band and a second polarization direction different from the first polarization direction and emitted from the second surface, reflect fifth light having the second wavelength band and the first polarization direction and emitted from the second surface, and transmit sixth light having the second wavelength band and the second polarization direction and emitted from the second surface, wherein light intensity of the fourth light is controlled by controlling light intensity of light having the first polarization direction out of the first light entering the wavelength conversion layer, and light intensity of light having the second polarization direction out of the first light entering the wavelength conversion layer, and the fifth light reflected by the polarization split element enters the wavelength conversion layer from the second surface of the wavelength conversion layer, and a part of the fifth light entering the wavelength conversion layer from the second surface is converted into the sixth light.

8. A projector comprising:
the light source device according to claim 1;
a light modulation device configured to modulate light from the light source device in accordance with image information; and
a projection optical device configured to project the light modulated by the light modulation device.

9. A projector comprising:
the light source device according to claim 2;
a light modulation device configured to modulate light from the light source device in accordance with image information; and
a projection optical device configured to project the light modulated by the light modulation device.

10. A projector comprising:
the light source device according to claim 3;
a light modulation device configured to modulate light from the light source device in accordance with image information; and
a projection optical device configured to project the light modulated by the light modulation device.

11. A projector comprising:
the light source device according to claim 4;
a light modulation device configured to modulate light from the light source device in accordance with image information; and
a projection optical device configured to project the light modulated by the light modulation device.

12. A projector comprising:
the light source device according to claim 5;
a light modulation device configured to modulate light from the light source device in accordance with image information; and
a projection optical device configured to project the light modulated by the light modulation device.

13. A projector comprising:
the light source device according to claim 6;
a light modulation device configured to modulate light from the light source device in accordance with image information; and
a projection optical device configured to project the light modulated by the light modulation device.

14. A projector comprising:
the light source device according to claim 7;
a light modulation device configured to modulate light from the light source device in accordance with image information; and
a projection optical device configured to project the light modulated by the light modulation device.

15. The light source device according to claim 1, further comprising:
a homogenization illumination system into which the fourth light and the sixth light transmitted from the polarization split element enter,
wherein the wavelength conversion layer, the polarization split element and the homogenization illumination system are arranged on a straight line.

* * * * *